(12) United States Patent
Vanderberg et al.

(10) Patent No.: US 7,696,494 B2
(45) Date of Patent: Apr. 13, 2010

(54) BEAM ANGLE ADJUSTMENT IN ION IMPLANTERS

(75) Inventors: Bo H. Vanderberg, Gloucester, MA (US); Xiangyang Wu, Andover, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 313 days.

(21) Appl. No.: 11/757,063

(22) Filed: Jun. 1, 2007

(65) Prior Publication Data
US 2008/0067442 A1 Mar. 20, 2008

Related U.S. Application Data

(60) Provisional application No. 60/812,847, filed on Jun. 12, 2006.

(51) Int. Cl.
*H01J 37/317* (2006.01)
*H01J 37/20* (2006.01)

(52) U.S. Cl. .............................. 250/492.21; 250/492.2; 250/396 R; 250/398

(58) Field of Classification Search ............ 250/492.21, 250/492.2, 396 R, 398
See application file for complete search history.

(56) References Cited

U.S. PATENT DOCUMENTS 5,160,846 A 11/1992 Ray

| | | | |
|---|---|---|---|
| 5,483,077 A * | 1/1996 | Glavish | 250/492.2 |
| 6,437,350 B1* | 8/2002 | Olson et al. | 250/492.21 |
| 2006/0043316 A1 | 3/2006 | Liebert et al. | |
| 2006/0145095 A1* | 7/2006 | Olson et al. | 250/492.21 |
| 2008/0078954 A1* | 4/2008 | Vanderberg et al. | 250/492.21 |
| 2009/0032726 A1* | 2/2009 | Sieradzki et al. | 250/400 |

FOREIGN PATENT DOCUMENTS

DE 69123708 7/1997

OTHER PUBLICATIONS

"MEMS Assembly of an Electrostatic Einzel Lens", J. Atulasimha, M. Dandin, K. Lauritzen, N. Pereira and A. Reis, University of Maryland, College Park, ENEE 605: Preliminary Report, reprinted from the Internet at: http://www.ece.umd.edu/class/enee605.F2004/grp/Group3_Preli_Report.pdf, 5 pgs.

* cited by examiner

*Primary Examiner*—Nikita Wells
(74) *Attorney, Agent, or Firm*—Eschweiler & Associates, LLC (57) ABSTRACT

A steering component is included in an ion implantation system to direct or "steer" an ion beam to a scan vertex of a scanning component downstream of the steering component. In this manner, the scan vertex of the scanning component coincides with the focal point of a parallelizing component downstream of the scanning component. This allows the beam to emerge from the parallelizing component at an expected angle so that ions can be implanted in a desired manner into a workpiece located downstream of the parallelizing component.

20 Claims, 7 Drawing Sheets

BEAM ANGLE ADJUSTMENT IN ION IMPLANTERS

REFERENCE TO RELATED APPLICATION

This application claims priority to and the benefit of U.S. Provisional Patent Application Ser. No. 60/812,847, which was filed Jun. 12, 2006, entitled BEAM ANGLE ADJUSTMENT IN ION IMPLANTERS, the entirety of which is hereby incorporated by reference as if fully set forth herein.

FIELD OF THE INVENTION

The present invention relates generally to ion implantation systems, and more particularly to adjusting an ion beam angle in an ion implanter.

BACKGROUND OF THE INVENTION

Ion implantation systems are mechanisms utilized to dope semiconductor substrates with impurities in integrated circuit manufacturing. In such systems, a dopant material is ionized and an ion beam is generated there-from. The ion beam is directed at the surface of a semiconductor wafer or workpiece to implant ions into the wafer. The ions of the beam penetrate the surface of the wafer and form regions of desired conductivity therein, such as in transistor fabrication, for example. A typical ion implanter includes an ion source for generating the ion beam, a beamline assembly including a mass analysis apparatus for directing and/or filtering (e.g., mass resolving) ions within the beam, and a target chamber containing one or more wafers or workpieces to be treated.

Ion implanters are advantageous because they allow for precision with regard to both quantity and placement of dopants within workpieces. In particular, ion implanters allow the dose and energy of implanted ions to be varied for given applications. The ion dose controls the concentration of implanted ions, where high current implanters are typically used for high dose implants, while medium current implanters are used for lower dose applications. Ion energy is used to control junction depth in semiconductor devices, for example, where the energy determines the depth to which ions are implanted within a workpiece.

It can be appreciated that given the trend in the electronics industry to scale down electronic devices to produce smaller, yet more powerful devices (e.g., cell phones, digital cameras, etc.), that the semiconductors and integrated circuits (e.g., transistors, etc.) utilized in these devices are continually being reduced in size. The ability to "pack" more of these devices onto a single semiconductor substrate, or portion thereof (known as a die) also improves fabrication efficiency and yield. It can be appreciated that controlling ion implantations plays an important role in successfully increasing packing densities. For example, there may be smaller margins for error with regard to the orientation (e.g., angle) of the ion beam relative to the mechanical surface and/or crystalline lattice structure of the workpiece. Accordingly, mechanisms and techniques that facilitate more control over ion implantations are desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

A steering component is included in an ion implantation system to direct or "steer" an ion beam to a scan vertex of a scanning component downstream of the steering component. In this manner, the scan vertex of the scanning component coincides with the focal point of a parallelizing component downstream of the scanning component. This allows the beam to emerge from the parallelizing component at an expected angle so that ions can be implanted in a desired manner into a workpiece located downstream of the parallelizing component.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 4 is a perspective view of an example of a portion of a crystalline lattice structure, such as that depicted in FIG. 1, wherein a mechanical surface of the structure is not substantially co-planar there-with.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

As alluded to above, in semiconductor fabrication processing, semiconductor wafers or workpieces are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

Figure 1:
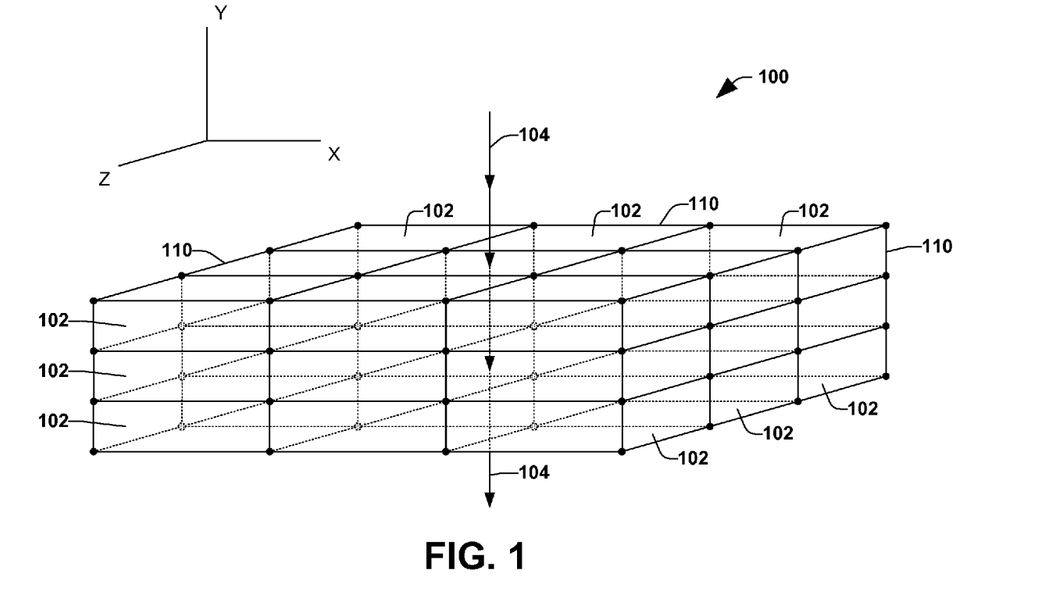
FIG. 1 is a perspective view of an example of a portion of a crystalline lattice structure wherein an ion beam is directed at the lattice structure substantially parallel to planes of the lattice structure.

The base layers or substrate are generally composed of silicon in a crystalline form. Materials are said to have a crystalline structure when their atoms are arranged in three dimensions in a regular manner, known as a crystalline lattice. By way of example, FIG. 1 illustrates a portion of a generic lattice structure 100 having a generally cubic configuration. In particular, in the example illustrated, the lattice structure 100 has twenty-seven (e.g., three by three by three) cells 102 that are generally cubical in shape. The lattice structure of the crystal exists within planes 110, and these planes 110 are substantially perpendicular to one another in the illustrated example (e.g., in the x, y, and z directions). It is to be appreciated, however, that lattice structures can come in any of a variety of different configurations and have any number of cells having any number of a variety of different shapes, such as diamond, pyramidal, hexagonal, etc.

The silicon base layers utilized in semiconductor fabrication are also referred to as wafers or substrates, at least in part, because they are cut from bulk silicon. In particular, very specific types of single crystals of silicon, known as boules, are grown into long lengths and thin slices (e.g., wafers) are cut there-from. Such wafers are generally designated with Miller Index data, such as (100) which is indicative of the relative orientation of the lattice structure to the cut surface of the wafer. The crystalline structure of the wafers is advantageous in electronic devices because it facilitates control of the electrical properties of the device and exhibits uniform electrical performance throughout the entire material. Additionally, because impurities that degrade device performance tend to collect around irregularities in the atomic structure of a material, the regularity of the crystalline structure provides for more predictable device performance and yield.

It can be appreciated that an important parameter of a semiconductor doping process is the angle of incidence between an ion beam and the internal lattice structure of the semiconductor material. The angle of incidence is important because it plays a role in a phenomenon known as channeling, among other things. In particular, as illustrated in FIG. 1, if the direction of the beam of dopant ions 104 is substantially parallel to (vertical) planes 110 of the lattice structure, the beam may pass there-through with less energy loss per unit length, because ions moving in the space between the planes have fewer collisions with crystal atoms. As such, the ions may be implanted deeply within the substrate.

Figure 2:
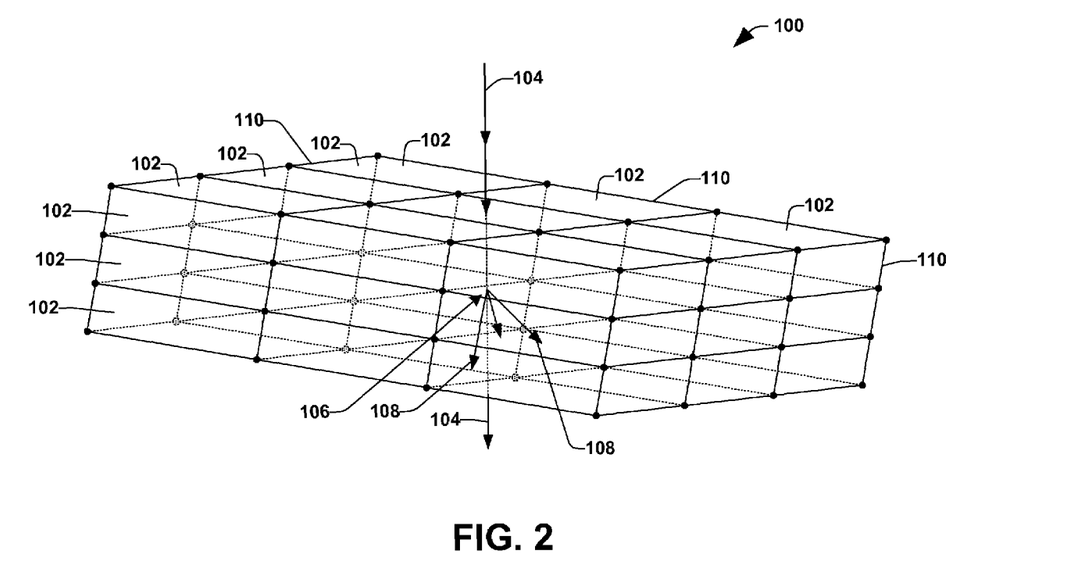
FIG. 2 is a perspective view of an example of a portion of a crystalline lattice structure, such as that depicted in FIG. 1, wherein an ion beam is directed at the lattice structure not substantially parallel to planes of the lattice structure.

In contrast to FIG. 1, the direction of the beam 104 in FIG. 2 is not substantially parallel to (vertical) planes 110 of the lattice structure 100. As such, some of the ions within the ion beam 104 will likely impact portions 106 of the lattice structure and alter (e.g., damage) the lattice structure. In so doing, the ions will likely lose energy and slow down and/or be scattered from their original trajectory as indicated by arrows 108, thereby coming to rest in shallower portions of the workpiece. Accordingly, it may be desirable to direct the ion beam at a particular orientation relative to the lattice structure to achieve a desired level of channeling and/or localization of doping, for example. It can be appreciated that it may also be desirable to maintain this relative orientation between the beam and the crystalline lattice structure while the relative orientation between the beam and the wafer is varied during the implantation process.

In addition to the orientation between the beam and the lattice structure of the wafer, it can be appreciated that the orientation of the beam relative to the mechanical surface of the wafer is also important to control shadowing, among other things, for example, where shadowing refers to situations where certain portions of the wafer may receive little to no dopant because the beam is blocked by one or more adjacent features on the wafer. The increasing importance of shadowing generally results from the continuing trend in the electronics industry to scale down features to produce smaller, more powerful devices (e.g., cell phones, digital cameras, etc.) that can perform a greater number of increasingly complex functions with less power.

Scaling generally requires that features formed in and on a wafer as part of the semiconductor fabrication process be formed closer together, and that the spacings established between such features be made narrower. The respective heights of some of the features may, however, not be reduced (e.g., due to photolithographic constraints). The generally fixed feature heights coupled with the shrinking spacings between features results in increased shadowing, whereby certain portions of the wafer less than a desired amount of dopants. Such shadowing can become more exaggerated where an ion implantation angle is increased, such as to diminish channeling, for example.

Figure 3:
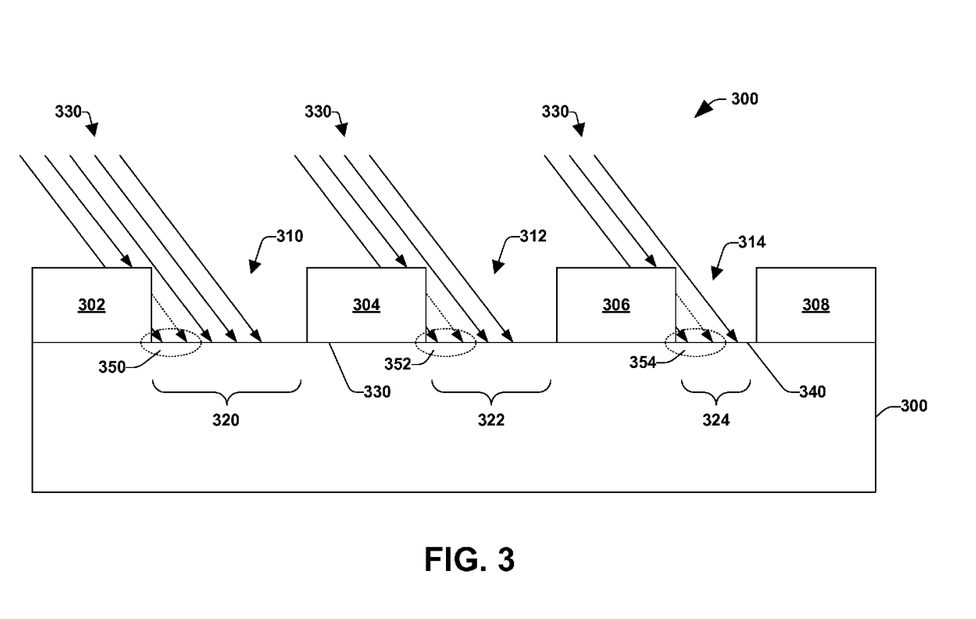
FIG. 3 is a cross-sectional view of a portion of a semiconductor substrate having features formed thereon that are separated by varying distances and that accordingly experiences shadowing effects to varying degrees during ion implantation.

Turning to FIG. 3, for example, a cross sectional view of a portion of a semiconductor substrate or wafer 300 has a plurality of features 302, 304, 306, 308 formed thereon, and respective spacings 310, 312, 314 defined there-between. The features 302, 304, 306, 308 can be formed out of a resist material or polysilicon material and thus are all of substantially the same height. Some of the features 302, 304, 306, 308 are, however, formed closer together than others, and thus the corresponding spacings 310, 312, 314 there-between are of different widths.

Areas 320, 322, 324 of the substrate 300 exposed by the spacings 310, 312, 314 are doped via ion implantation. Accordingly, one or more ion beams 330 are directed at the substrate 300 to perform the doping. The beams 330 are, however, oriented at an angle with respect to a surface 340 of the substrate 300 to mitigate channeling, for example. Some of the beams 330 thus have some of their ions blocked by portions (e.g., corners) of the features 302, 304, 306, 308. As such, regions 350, 352, 354 within the substrate areas 320, 322, 324 receive less than intended amounts of dopant ions. It can be seen that as the features 302, 304, 306, 308 are brought closer together and the respective spacings 310, 312, 314 are thereby made more narrow, the insufficiently doped regions 350, 352, 354 make up larger portions of the substrate areas 320, 322, 324.

Figure 4:
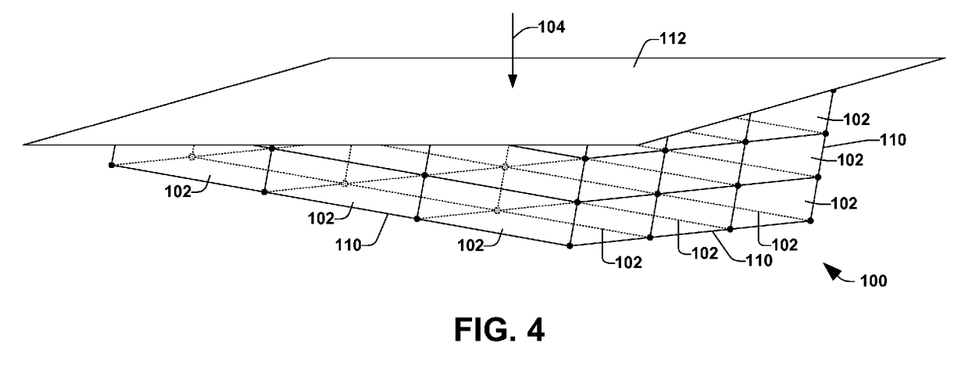

FIG. 4 is similar to FIGS. 1 and 2, but illustrates a common situation where the mechanical surface 112 of the wafer is not coplanar with the crystalline lattice structure of the wafer due to crystal cut error, for example. It can thus be appreciated that the beam and/or wafer may need to be moved during the implantation process to maintain the relative orientation between the mechanical surface 112 of the wafer and the ion beam 104 and/or the relative orientation between the crystalline lattice structure of the wafer and the ion beam 104 to maintain a desirable balance between channeling and shadowing, for example.

Figure 5:
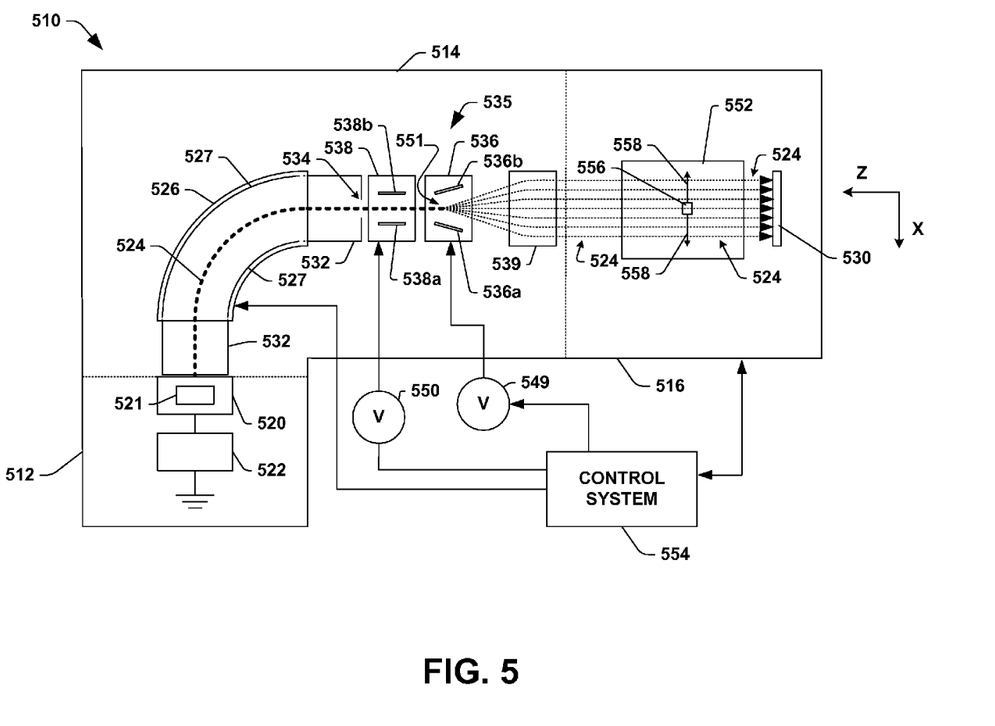
FIG. 5 is a block diagram illustrating an exemplary ion implantation system wherein an ion beam is steered through a scan vertex of a scanning element of the system as described herein, where the scan vertex coincides with the focal point of a parallelizing element of the system.

FIG. 5 illustrates an exemplary ion implantation system 510 wherein beam angle can be adjusted as described herein. The system 510 has a terminal 512, a beamline assembly 514, and an end station 516. The terminal 512 includes an ion source 520 powered by a high voltage power supply 522 that produces and directs an ion beam 524 to the beamline assembly 514. The ion source 520 generates charged ions that are extracted and formed into the ion beam 524, which is directed along a beam path in the beamline assembly 514 to the end station 516. To generate the ions, a gas of a dopant material (not shown) to be ionized is located within a generation chamber 521 of the ion source 520. The dopant gas can, for example, be fed into the chamber 521 from a gas source (not shown). In addition to power supply 522, it will be appreciated that any number of suitable mechanisms (none of which are shown) can be used to excite free electrons within the ion generation chamber 521, such as RF or microwave excitation sources, electron beam injection sources, electromagnetic sources and/or a cathode which creates an arc discharge within the chamber, for example. The excited electrons collide with the dopant gas atoms or molecules and ions are generated thereby. Generally, positive ions are generated although the disclosure herein is applicable to systems wherein negative ions are generated as well.

The beamline assembly 514 has a beamguide 532, a mass analyzer 526, a scanning system 535, and a parallelizer 539. The mass analyzer 526 is formed at about a ninety degree angle and comprises one or more magnets (not shown) that serve to establish a (dipole) magnetic field therein. As the beam 524 enters the mass analyzer 526, it is correspondingly bent by the magnetic field such that ions of an inappropriate charge-to-mass ratio are rejected. More particularly, ions having too great or too small a charge-to-mass ratio are deflected into side walls 527 of the mass analyzer 526. In this manner, the mass analyzer 526 merely allows those ions in the beam 524 which have the desired charge-to-mass ratio to pass there-through and exit through a resolving aperture 534. It will be appreciated that ion beam collisions with other particles in the system 510 can degrade beam integrity. Accordingly, one or more pumps (not shown) may be included to evacuate, at least, the beamguide 532 and mass analyzer 526.

The scanning system 535 includes a scanning element 536 and a focusing and/or steering element 538. Respective power supplies 549, 550 are operatively coupled to the scanning element 536 and the focusing and steering element 538, and more particularly to respective electrodes 536a, 536b and 538a, 538b located therein. The focusing and steering element 538 receives the mass analyzed ion beam 524 having a relatively narrow profile (e.g., a "pencil" beam in the illustrated system 510), and a voltage applied by the power supply 550 to the plates 538a and 538b operates to focus and steer the beam to the scan vertex 551 of the scanning element 536. A voltage waveform applied by the power supply 549 (which theoretically could be the same supply as 550) to the scanner plates 536a and 536b then scans the beam 524 back and forth in the X direction (the scan direction) to spread the beam 524 out into an elongated "ribbon" beam (e.g., a scanned beam 524), having an effective X direction width that may be at least as wide as or wider than the workpieces of interest. It will be appreciated that the scan vertex 551 can be defined as the point in the optical path from which each beamlet or scanned part of the ribbon beam appears to originate after having been scanned by the scanning element 536. The scanned beam 524 is then passed through the parallelizer 539, which is a lens with a focal point corresponding to or aligned with the scan vertex 551, and that focuses any beam passing through the scan vertex 551 to infinity and thus directs the beam toward the end station 516 generally parallel to the Z direction (e.g., generally perpendicular to the workpiece surface).

It will be appreciated that while two electrodes 536a, 536b and 538a, 538b are respectively illustrated in the exemplary scanning element 536 and focusing and steering element 538, that these elements 536, 538 may comprise any suitable number of electrodes arranged and biased to accelerate and/or decelerate ions, as well as to focus, bend and/or decontaminate the ion beam 526 such as is depicted in U.S. Pat. No. 6,777,696 to Rathmell et al. the entirety of which is hereby incorporated herein by reference. Additionally, the focusing and steering element 538 may comprise electrostatic deflection plates (e.g., one or more pairs thereof), as well as an Einzel lens, quadrupoles and/or other focusing elements to focus the ion beam. Although not necessary, it can be advantageous to apply voltages to the deflecting plates within element 538 so that they average to zero, the effect of which is to avoid introducing an additional Einzel lens and minimize the distortion of the focusing aspect of element 538 It will be appreciated that "steering" the ion beam is a function of the dimensions of plates 538a, 538b and the steering voltages applied thereto, among other things, as the beam direction is proportional to the steering voltages and the length of the plates, and inversely proportional to the beam energy.

It will be appreciated that different types of end stations 516 may be employed in the implanter 510. For example, a "batch" type end station can simultaneously support multiple workpieces 530 on a rotating support structure, wherein the workpieces 530 are rotated through the path of the ion beam until all the workpieces 530 are completely implanted. A "serial" type end station, on the other hand, supports a single workpiece 530 along the beam path for implantation, wherein multiple workpieces 530 are implanted one at a time in serial fashion, with each workpiece 530 being completely implanted before implantation of the next workpiece 530 begins. In hybrid systems the workpiece 530 may be mechanically translated in a first (Y or slow scan) direction while the beam is scanned in a second (X or fast scan) direction to impart the beam 524 over the entire workpiece 530.

The end station 516 in the illustrated example is a "serial" type end station that supports a single workpiece 530 along the beam path for implantation. A dosimetry system 552 is included in the end station 516 near the workpiece location for calibration measurements prior to implantation operations. During calibration, the beam 524 passes through dosimetry system 552. The dosimetry system 552 includes one or more profilers 556 that may continuously traverse a profiler path 558, thereby measuring the profile of the scanned beams. The profiler 556 may comprise a current density sensor, such as a Faraday cup, for example, that measures the current density of the scanned beam, where current density is a function of the angle of implantation (e.g., the relative orientation between the beam and the mechanical surface of the workpiece and/or a calibrated reference of beam diagnostics in the system). The current density sensor moves in a generally orthogonal fashion relative to the scanned beam and thus typically traverses the width of the ribbon beam. The dosimetry system, in one example, measures both beam density distribution and angular distribution. Measurement of beam angles can use a moving profiler sensing current behind a mask with slots as described in R. D. Rathmell, D. E. Kamenitsa, M. I. King, and A. M. Ray, *IEEE Proc. of Intl. Conf. on Ion Implantation Tech.*, Kyoto, Japan 392-395 (1998), U.S. patent application Ser. No. 11/288,908 to Rathmell et al. entitled ION IMPLANTATION BEAM ANGLE CALIBRATION and U.S. patent application Ser.

No. 11/290,344 to Rathmell et al. entitled MEANS TO ESTABLISH ORIENTATION OF ION BEAM TO WAFER AND CORRECT ANGLE ERRORS the entirety of which are hereby incorporated herein by reference. The displacement of each individual beamlet from a known slot position (not shown) after a short drift can be use to calculate the beamlet angle. It will be appreciated that this displacement may be referred to as a calibrated reference of beam diagnostics in the system. Note that there are generally multiple beamlets and that respective beamlets can pass through one or more different slots.

The dosimetry system 552 is operably coupled to a control system 554 to receive command signals therefrom and to provide measurement values thereto. For example, the control system 554, which may comprise a computer, microprocessor, etc., may be operable to take measurement values from the dosimetry system 552 and calculate an average angle distribution of the scanned ribbon beam across the workpiece, and then adjust the voltage applied to the steering element 538 to achieve a desired angle of implantation. The control system 554 is also coupled to the beamline assembly 514 in the illustrated example. More particularly, the control system 554 is operatively coupled to the mass analyzer 526, so that the strength and orientation of magnetic field(s) generated therein can be adjusted, such as by regulating the amount of electrical current running through field windings (not shown) of one or more magnets of the mass analyzer 526.

Figure 6:
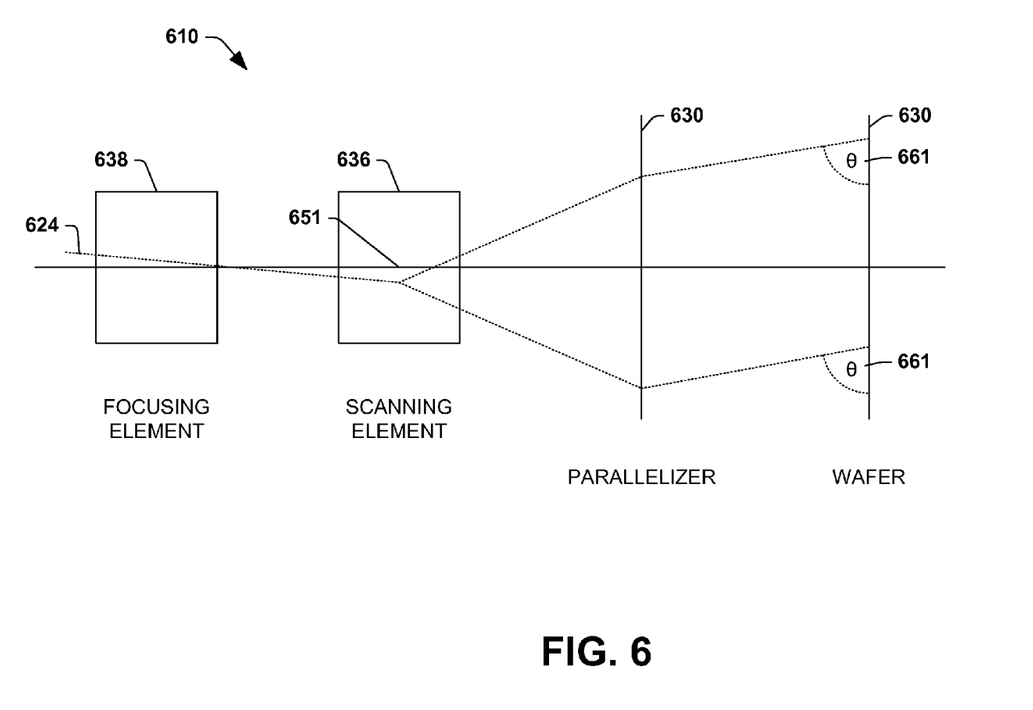
FIG. 6 is a schematic diagram illustrating how an implantation angle can be compromised when an ion beam is not made to pass through a scan vertex of a scanning element as described herein.

FIG. 6 illustrates how angle control is compromised when an ion beam does not pass through the scan vertex of a scanning element of an ion implantation system. In particular, an ion beam 624 is illustrated as passing into a focusing element 638 of the ion implantation system 610. However, the focusing element 638 does not include a steering component to direct the beam 624 to the scan vertex 651 of the scanning element 636 downstream of the focusing element 638. As such, while the beam 624 may be focused to a fine pencil beam by the focusing element 638, the beam may nevertheless arrive at a location other than the scan vertex 651 of the scanning element 636. It can be seen that the scanning element 636 propagates this error to the parallelizer 639 such that the beams output by the parallelizer 639 are imparted to the workpiece 630 at undesirable and unpredictable angles θ 661.

It can be appreciated that the incidence of ion beams not passing through the scan vertex of scanning elements in ion implantation systems is increasing due to ongoing efforts to facilitate device scaling. More particularly, in an effort to pack more devices into the same or smaller areas, device features such as junction depths and/or other feature depths are being made shallower. To establish an area that is not implanted as deeply as it used to be, high current, low energy (high perveance) implants are used to place an abundance of dopant atoms in a shallow area of the substrate. However, the high perveance of these beams commonly causes difficulties in maintaining beam trajectory. Other aspects of the implantation process, nevertheless, also lead to the beam not passing through the ideal scan vertex of the scanning element. In addition to space charge and other effects, for example, as the beam is transported along the beam path toward the workpiece, the beam may encounter various electric and/or magnetic fields and devices that may alter the trajectory of the beam. By way of example, low energy implanters are typically designed to provide ion beams of a few thousand electron volts (keV) up to around 80-100 keV, whereas high energy implanters can employ RF linear acceleration (linac) apparatus (not shown) between the mass analyzer and the end station to accelerate the mass analyzed beam to higher energies, typically several hundred keV, wherein DC acceleration is also possible.

Figure 7:
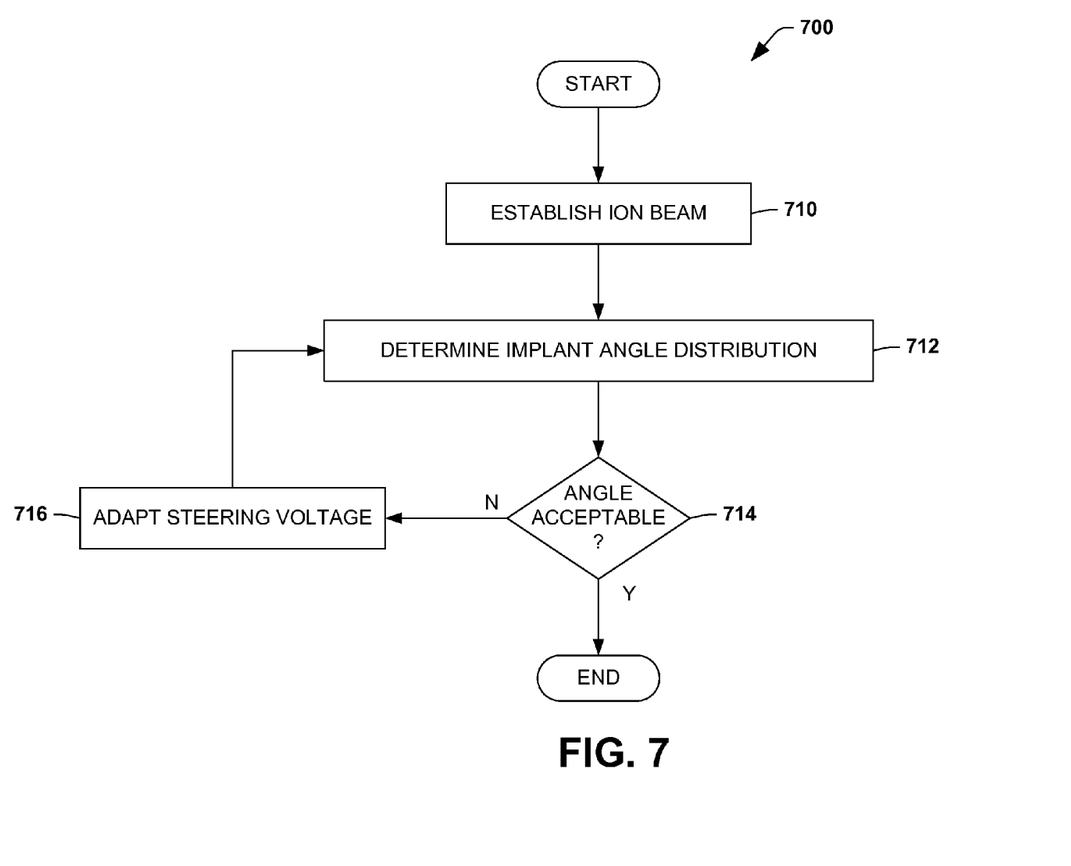
FIG. 7 is an exemplary methodology for causing an ion beam to be steered through the scan vertex of a scanning element of an ion implantation system as described herein.

Turning to FIG. 7 an exemplary methodology 700 is illustrated for correcting a beam angle in an ion implantation system, and more particularly for steering the beam to the scan vertex of a scanning element of the implantation system. Although the methodology 700 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated acts may be required to implement a methodology in accordance with the present invention.

The method 700 begins at 710 where an ion beam that is scanned across a workpiece is generated in the ion implantation system. The beam is, for example, established to have a desired dopant specie, energy and/or current. The method then advances to 712 where an implant angle distribution is determined. This may be accomplished, for example, by utilizing a dosimetry system that determines the current density of the beam as it is scanned across the wafer, where current density is a function of the angle of implantation (e.g., the relative orientation between the beam and the mechanical surface of the workpiece and/or the relative orientation between the beam and a calibrated reference of beam diagnostics in the system). The implantation angle distribution can be determined by analyzing the data obtained from the dosimetry system (e.g., as described above).

At 714, a determination is made as to whether the average implantation angle is acceptable. If it is, the method advances to an ending state. If the average angle is not acceptable, the method moves to 716 where a voltage applied to a steering element of the ion implantation system is adapted. Adjusting the voltage applied to the steering element causes the beam to be moved toward the scan vertex of a scanning element in the ion implantation system. The adjustment to be made to the steering voltage can be determined by calculating refractions of the average angle thru the optical train of the implanter where acceleration and/or deceleration stages of the ion implantation system are used. In particular, deceleration/acceleration of a beam with an angle error magnifies/demagnifies the angle by a factor $M=(Ein/Eout)^{1/2}$, where Ein is the energy before deceleration/acceleration and Eout is the energy after deceleration/acceleration. In analogy to light optics, this magnification can be referred to as refraction. The steering voltage is then adjusted given the refraction index and the sensitivity of angle to steering voltage. For example, the necessary angle correction by the steering element is calculated from the angle error measured at the wafer corrected for refraction occurring between steering element and wafer. After the steering voltage is adjusted at 716, the method reverts to 712 where the implant angle is again determined. The process is repeated until an acceptable implant angle is achieved, and ends thereafter.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, elements, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, "exemplary" as utilized herein merely means an example, rather than the best.

What is claimed is:

1. A method of correcting an implantation angle in an ion implantation system, comprising:
generating an ion beam in an ion implantation system;
determining an implant angle distribution of at least one of
the ion beam relative to the mechanical surface of a workpiece into which ions are implanted by the beam, and
the ion beam relative to a calibrated reference of beam diagnostics in the implantation system;
determining whether the implant angle distribution is acceptable; and
adjusting a steering voltage to promote an acceptable implant angle distribution if the implant angle distribution is not acceptable.

2. The method of claim 1, the calibrated reference of beam diagnostics corresponding to drift of one or more beamlets of the ion beam after passing through one or more known slots in the implantation system.

3. The method of claim 1, comprising:
determining an average implant angle from the implant angle distribution;
determining whether the average implant angle is acceptable; and
adjusting the steering voltage to promote an acceptable average implant angle if the average implant angle is not acceptable.

4. The method of claim 3, comprising:
calculating refractions of the average implant angle; and
adjusting the steering voltage based on the calculated refractions.

5. The method of claim 2, comprising:
determining an average implant angle from the implant angle distribution;
determining whether the average implant angle is acceptable; and
adjusting the steering voltage to promote an acceptable average implant angle if the average implant angle is not acceptable.

6. The method of claim 5, comprising:
calculating refractions of the average implant angle; and
adjusting the steering voltage based on the calculated refractions.

7. The method of claim 1, adjusting the steering voltage of a steering component causing the ion beam to be moved toward a scan vertex of a scanning component located downstream of the steering component of the implantation system.

8. An ion implantation system, comprising:
a component for generating an ion beam;
a component for mass resolving the ion beam;
a steering component for steering the ion beam to a focal point of a parallelizing component located downstream of the steering component and configured to parallelize the ion beam; and
an endstation located downstream of the parallelizing component and configured to support a workpiece that is to be implanted with ions by the ion beam.

9. The system of claim 8, the steering component comprising at least one pair of electrodes.

10. The system of claim 8, the steering component comprising at least one pair of electrostatic deflection plates.

11. The system of claim 8, comprising:
a measurement component configured to measure an implant angle distribution of at least one of
the ion beam relative to the mechanical surface of the workpiece, and
the ion beam relative to a calibrated reference of a beam diagnostic system; and
a controller operatively coupled to the measurement component and the steering component, and configured to adjust the operation of the steering component to steer the ion beam toward the focal point of the paralleizing component in response to measurements taken by the measurement component.

12. The system of claim 11, the calibrated reference of beam diagnostics corresponding to drift of one or more beamlets of the ion beam after passing through one or more known slots in the implantation system.

13. The system of claim 11, the steering component comprising at least one of
at least one pair of electrodes, and
at least one pair of electrostatic deflection plates,
and the controller adjusting the operation of the steering component by adjusting a voltage applied to least one of the at least one pair of electrodes and the at least one pair of electrostatic deflection plates.

14. The system of claim 13, the operation of the steering component adjusted based on calculated refractions of an average implant angle.

15. An ion implantation system, comprising:
a component for generating an ion beam;
a component for mass resolving the ion beam;
a steering component for steering the ion beam to a scan vertex of a scanning component located downstream of the steering component and configured to scan the ion beam;
a parallelizing component located downstream of the scanning component and configured to parallelize the scanned ion beam; and
an endstation located downstream of the parallelizing component and configured to support a workpiece that is to be implanted with ions by the scanned ion beam.

16. The system of claim 15, a focal point of the parallelizing component corresponding to the scan vertex of the scanning component.

17. The system of claim 16, comprising:
a measurement component configured to measure an implant angle distribution of at least one of
the ion beam relative to the mechanical surface of the workpiece, and
the ion beam relative to a calibrated reference of a beam diagnostic system; and
a controller operatively coupled to the measurement component and the steering component, and configured to adjust the operation of the steering component to steer the ion beam toward the focal point of the paralleizing component in response to measurements taken by the measurement component.

18. The system of claim 17, the calibrated reference of beam diagnostics corresponding to drift of one or more beamlets of the ion beam after passing through one or more known slots in the implantation system.

19. The system of claim 17, the steering component comprising at least one of at least one pair of electrodes, and at least one pair of electrostatic deflection plates, and the controller adjusting the operation of the steering component by adjusting a voltage applied to least one of the at least one pair of electrodes and the at least one pair of electrostatic deflection plates.

20. The system of claim 19, the operation of the steering component adjusted based on calculated refractions of an average implant angle.

* * * * *